United States Patent
Guettaf

(10) Patent No.: US 7,424,417 B2
(45) Date of Patent: Sep. 9, 2008

(54) SYSTEM AND METHOD FOR CLOCK DOMAIN GROUPING USING DATA PATH RELATIONSHIPS

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 768 days.

(21) Appl. No.: 10/299,257

(22) Filed: Nov. 19, 2002

(65) Prior Publication Data

US 2004/0098241 A1    May 20, 2004

(51) Int. Cl.
G06F 17/50    (2006.01)

(52) U.S. Cl. .................... 703/14; 324/528; 324/535; 324/763; 324/765; 703/22; 703/15; 703/19; 712/36; 714/30; 714/738; 714/739; 714/726; 714/728; 716/4; 716/5; 716/6

(58) Field of Classification Search .................. 716/18, 716/6, 1, 4, 2; 714/25, 30, 700, 731, 738; 324/158.1, 73.1; 712/36; 703/22
See application file for complete search history.

(56) References Cited

U.S. PATENT DOCUMENTS

| 5,032,783 | A  | * | 7/1991  | Hwang et al. ............... 324/73.1 |
| 5,384,533 | A  | * | 1/1995  | Tokuda et al. ............. 324/158.1 |
| 5,828,579 | A  | * | 10/1998 | Beausang ...................... 716/2 |
| 6,106,568 | A  | * | 8/2000  | Beausang et al. ............. 716/18 |
| 6,324,678 | B1 | * | 11/2001 | Dangelo et al. ............... 716/18 |
| 6,539,497 | B2 | * | 3/2003  | Swoboda et al. ............. 714/30 |
| 6,766,501 | B1 | * | 7/2004  | Duggirala et al. ............ 716/11 |
| 6,957,403 | B2 | * | 10/2005 | Wang et al. ..................... 716/3 |
| 2002/0166098 | A1 | * | 11/2002 | Chang et al. ................... 716/1 |
| 2002/0171449 | A1 | * | 11/2002 | Shimizu et al. ............. 324/765 |
| 2002/0184560 | A1 | * | 12/2002 | Wang et al. .................... 714/25 |
| 2002/0188888 | A1 | * | 12/2002 | Rivoir ......................... 714/25 |
| 2003/0009715 | A1 | * | 1/2003  | Ricchetti et al. ............ 714/727 |
| 2003/0023941 | A1 | * | 1/2003  | Wang et al. .................... 716/4 |
| 2003/0101331 | A1 | * | 5/2003  | Boylan et al. ................ 712/36 |
| 2003/0115564 | A1 | * | 6/2003  | Chang et al. ................... 716/8 |
| 2003/0131298 | A1 | * | 7/2003  | Rajski et al. ................ 714/738 |
| 2003/0188214 | A1 | * | 10/2003 | Altmayer et al. ............ 713/500 |
| 2003/0208350 | A1 | * | 11/2003 | Rich et al. .................... 703/22 |
| 2003/0217341 | A1 | * | 11/2003 | Rajsuman et al. ............. 716/4 |
| 2004/0193983 | A1 | * | 9/2004  | Whetsel, Jr. ................ 714/731 |
| 2005/0114811 | A1 | * | 5/2005  | Schultz ......................... 716/6 |
| 2005/0125751 | A1 | * | 6/2005  | Miller et al. ................... 716/4 |
| 2005/0160331 | A1 | * | 7/2005  | Wilsher ...................... 714/700 |
| 2005/0204235 | A1 | * | 9/2005  | Kretchmer et al. .......... 714/733 |
| 2005/0229123 | A1 | * | 10/2005 | Wang et al. ..................... 716/4 |

* cited by examiner

*Primary Examiner*—Kamini Shah
*Assistant Examiner*—Cuong V Luu
(74) *Attorney, Agent, or Firm*—McAndrews, Held & Malloy, Ltd.

(57) ABSTRACT

A method and system are disclosed, in a simulation of a design of a digital integrated circuit chip, to limit a number of scan test clocks and chip ports used for testing the chip. Clock domains are identified within the design of the chip that are independent of each other. The independent clock domains are grouped together, within said chip design, to form clock domain groups. A timing analysis is performed on the design of the chip by clocking the clock domain groups each with an independent scan test clock. The scan test clocks originate externally to the design and by-pass, within the chip design, the corresponding internal clocks. Capture mode violations are recorded from the timing analysis and are used to go back and form new clock domain groups, thereby repeating the method until no capture mode violations are generated.

19 Claims, 4 Drawing Sheets

SYSTEM AND METHOD FOR CLOCK DOMAIN GROUPING USING DATA PATH RELATIONSHIPS

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Digital integrated circuit chips are composed of many millions of gates that make up various functional components on a chip such as flip-flops, multiplexors, logic circuits, etc. A given chip design may have thousands of flip-flops scattered throughout the chip.

In order to effectively and efficiently test a given chip, certain test features are typically incorporated into the chip design for testing purposes. Before a chip is actually taped out and manufactured, the chip design is first simulated in software using various simulation tools such as, for example, an Automatic Test Pattern Generation (ATPG) tool. By simulating the design of the chip, the design features of the chip may be thoroughly tested before the expense and time of actually manufacturing the chip is incurred.

Pattern verification is a critical phase in testing of chips. A scan pattern is a digital string of binary ones and zeros that may be shifted through a scan chain of flip-flops in the chip design. Every scan pattern cycle is composed of two phases. The first phase is the load-unload phase where new data is shifted into the scan chains of flip-flops. The second phase is the capture phase where the data is captured into the flip-flops by applying a clock pulse.

Typically, the flip-flops in a digital integrated circuit design are designed such that they have normal data inputs and outputs (D and Q) and test inputs such as TI (test data input) and TE (test enable input). During simulation, the flip-flops may be placed in the scan test mode by enabling the TE input. Data may then be clocked into the flip-flops through the TI input instead of the normal D data input. During scan testing, the flip-flops of the chip are chained together to form multiple scan chains. The output Q of a given flip-flop is connected to the input TI of a next flip-flop. Each scan chain may comprise, typically, 5000 to 10,000 flip-flops.

The length of the load_unload phase is equal to the length of the longest scan chain of flip-flops. In multimillion gate designs, the longest chain may have thousands of flip-flops. Most of the time simulating the scan patterns through the scan chains is spent shifting the data into and out of the scan chains. To ensure proper behavior of the scan chains, the first test applied to the chip design is Chain Test which consists of shifting in and out a predetermined bit pattern (e.g., 0011).

Timing analysis may be performed on the simulation of the design of the chip by using external scan test clocks to clock the various clock domains (flip-flops and other digital logic that use a same clock). For every clock domain, an external scan test clock may be input at a port of the chip and used to clock the corresponding clock domain by by-passing the corresponding internal clock for the clock domain. The timing analysis identifies any capture mode violations such that the design may be fixed to eliminate the violations. However, such simulation and testing often require many scan test clocks using many ports of the chip in order to test all of the clock domains, especially for large chips with millions of gates. Even if certain ports of the chip are externally tied together at the chip level to the same scan clock, a single port of the chip is still needed for each clock domain within the chip. In the capture mode during timing analysis, scan patterns are clocked into the D inputs of the flip-flops instead of the TI inputs.

One of the major issues in generating tests for multi-million gate chip designs is how to reduce ATPG pattern count in order to fit in the tester memory. Designs with multiple clock domains pose a great challenge given that, by default, ATPG tools toggle one clock at a time during a capture mode. The number of scan clocks that may be required to be provided from the chip level may be very large if the chip design has a large number of internal clock domains. Each scan clock operates at the same frequency using the same waveform. Some clock domains may be grouped together solely based on designer input, but this has proven to cause timing problems if the clock domains that are grouped are not truly independent (i.e., share no data paths).

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method is provided, in a simulation of a design of a digital integrated circuit chip, to limit a number of scan test clocks and chip ports used for testing the chip. Clock domains are identified within the design of the chip that are independent of each other. The independent clock domains are grouped together, internal to the chip design, to form clock domain groups. A timing analysis is performed on the design of the chip by clocking the clock domain groups each with an independent scan test clock. The scan test clocks originate externally to the design, by-passing the corresponding internal clocks. Capture mode violations are recorded from the timing analysis and are used to go back and form new clock domain groups, thereby repeating the method until no capture mode violations are generated.

A system is provided and used in a simulation of a design of a digital integrated circuit chip to limit a number of scan test clocks and chip ports used for testing the chip. The system comprises an automatic test pattern generation (ATPG) tool to identify clock domains within the design of the chip that are independent of each other, and to group, internally to the chip design, the independent clock domains to form clock domain groups. The clock domain groups are stored as a clock grouping report in the ATPG tool. A timing analysis tool is also provided to perform timing analysis of the design of the chip by clocking the clock domain groups each with an independent scan test clock that originates externally to the chip design. Capture mode violations are generated by the timing analysis and are used to go back and form new clock domain groups, thereby repeating the process until no capture mode violations are generated.

These and other advantages and novel features of the present invention, as well as details of an illustrated embodiment thereof, will be more fully understood from the following description and drawings.

DETAILED DESCRIPTION OF THE INVENTION

Aspects of the present invention provide a method and system to limit a number of scan test clocks and chip ports used for testing a digital integrated circuit chip having millions of gates.

Figure 1:
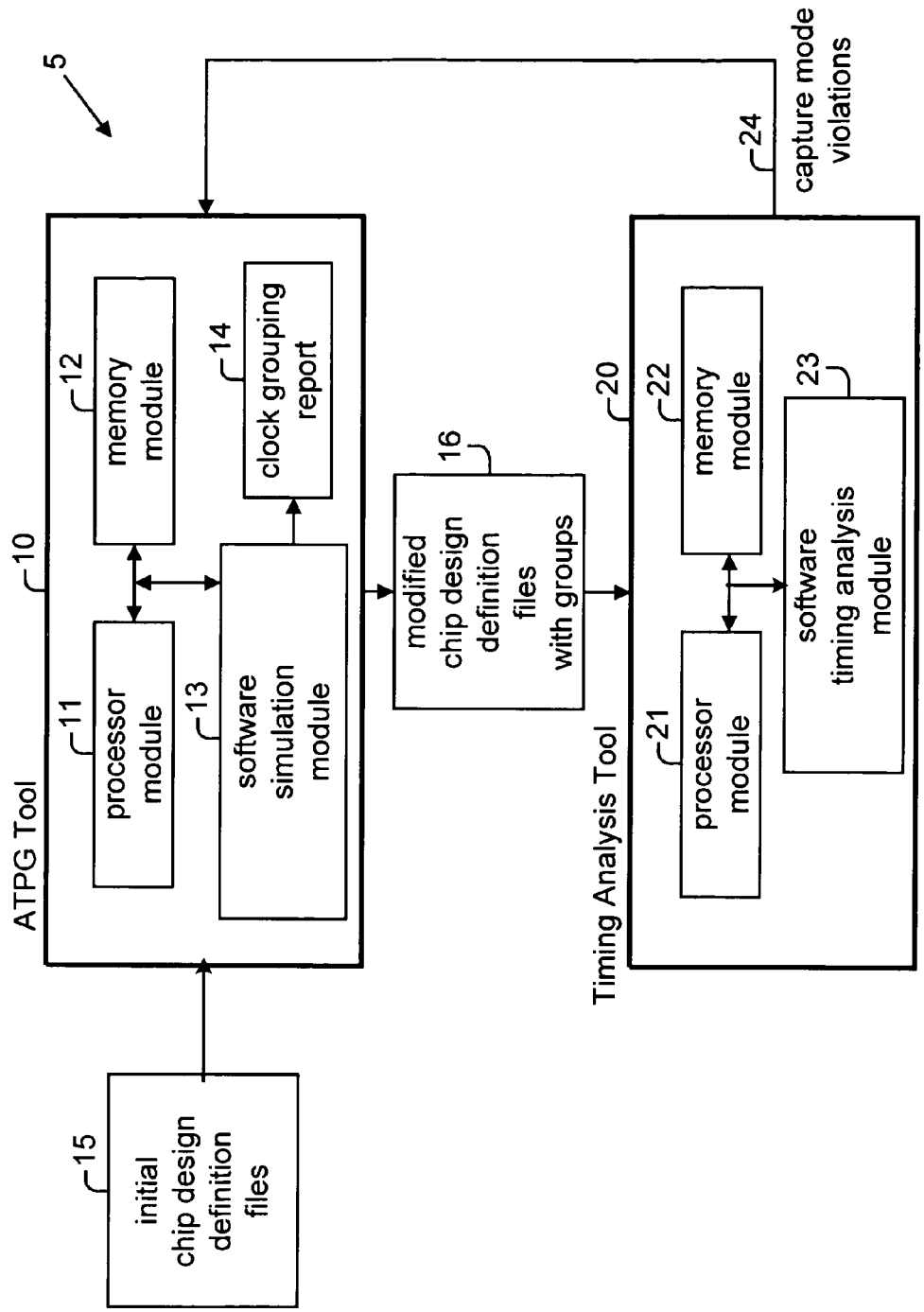
FIG. 1 is a schematic block diagram of an exemplary simulation and test system in accordance with an embodiment of the present invention.

FIG. 1 is a schematic block diagram of an exemplary simulation and test system 5 in accordance with an embodiment of the present invention. The system 5 comprises an Automatic Test Pattern Generating (ATPG) tool 10 and a Timing Analysis (TA) tool 20. In an embodiment of the present invention, at a top level, the ATPG tool 10 inputs a set of initial chip design definition files 15 and capture mode violation information 24, and generates a clock grouping report 14. The clock grouping report 14 is used to generate a modified set of chip design definition files 16. The set of initial chip design definition files 15 completely defines the initial design of a digital integrated circuit chip. The modified set of chip design definition files 16 completely defines a modified version of the digital integrated circuit chip.

The TA tool 20 inputs the modified set of chip design definition files 16 and outputs the capture mode violation information 24. The capture mode violation information 24 is then fed back and input to the ATPG tool 10 and a new grouping report 14 may be generated.

In accordance with an embodiment of the present invention, the ATPG tool 10 comprises at least one processor module 11 and at least one memory module 12. The ATPG tool 10 also comprises at least one software simulation module 13 that is stored in the at least one memory module 12 and is executed on the at least one processor module 11. In an embodiment of the present invention, the ATPG tool 10 generates the clock grouping report 14. The clock grouping report 14 is used to generate the modified set of chip design definition files 16. The ATPG tool 10 may be, for example, a commercial Tetramax ATPG tool from Synopsis, or may be some other ATPG tool.

In accordance with an embodiment of the present invention, the TA tool 20 comprises at least one processor module 21 and at least one memory module 22. The TA tool 20 also comprises at least one software timing analysis module 23 that is stored in the at least one memory module 22 and is executed on the at least one processor module 21. In an embodiment of the present invention, the TA tool 20 generates the capture mode violation information 24. The capture mode violation information 24 is fed back to the ATPG tool 10 and is used to generate a new clock grouping report 14.

Figure 2:
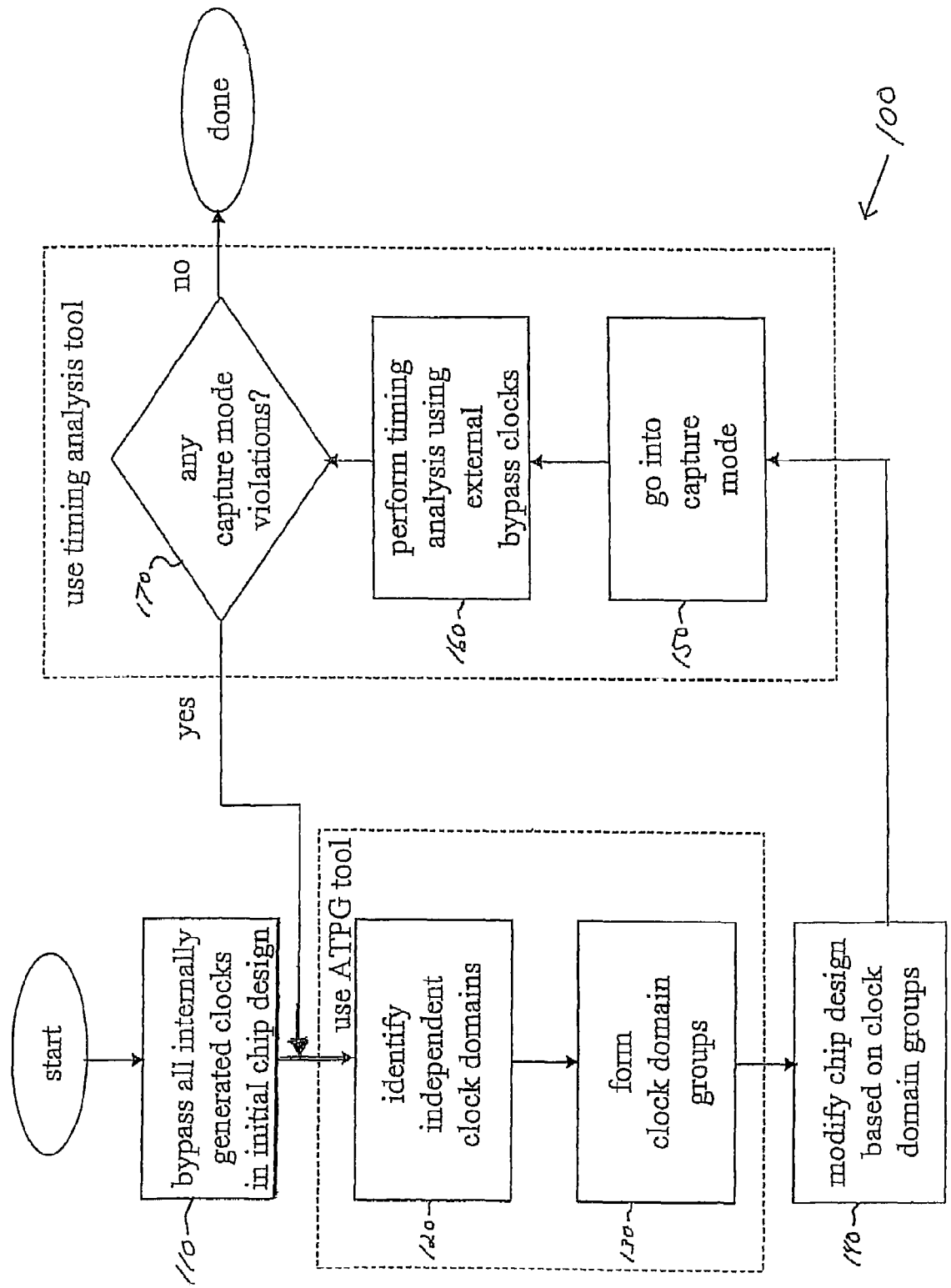
FIG. 2 is a flowchart of a method operating on the test system of FIG. 1 to limit a number of scan test clocks and chip ports used for testing a digital integrated circuit chip in accordance with an embodiment of the present invention.

Referring to FIG. 2, method 100 defines a process to limit a number of scan test clocks and chip ports used for testing the design of the chip with the system 5, for example. In step 110, the initial design of the chip internally by-passes, at the core level, all internally generated clocks. In step 120, the ATPG tool 10 inputs the initial design definition files 15 and attempts to identify the clock domains that are independent (i.e., share no data paths between them). In step 130, the ATPG tool 10 forms clock domain groups based on the independence analysis. The clock domain groups are stored in the clock grouping report 14. The design of the chip is again modified internally to tie each clock domain group to a single port of the chip. In an embodiment of the present invention, the modification of the design of the chip may be performed by the ATPG tool 10. As an alternative, the actual modification of the design of the chip may be performed off-line using some other tool such as a computer-based chip design tool.

In step 150, the TA tool 20 inputs the modified set of design definition files 16 and goes into a capture mode. In step 160, while in the capture mode, the TA tool 20 performs a timing analysis to determine if there are any capture mode violations in the modified design. Capture mode violations are typically caused by timing violations in the design of the chip.

Figure 3:
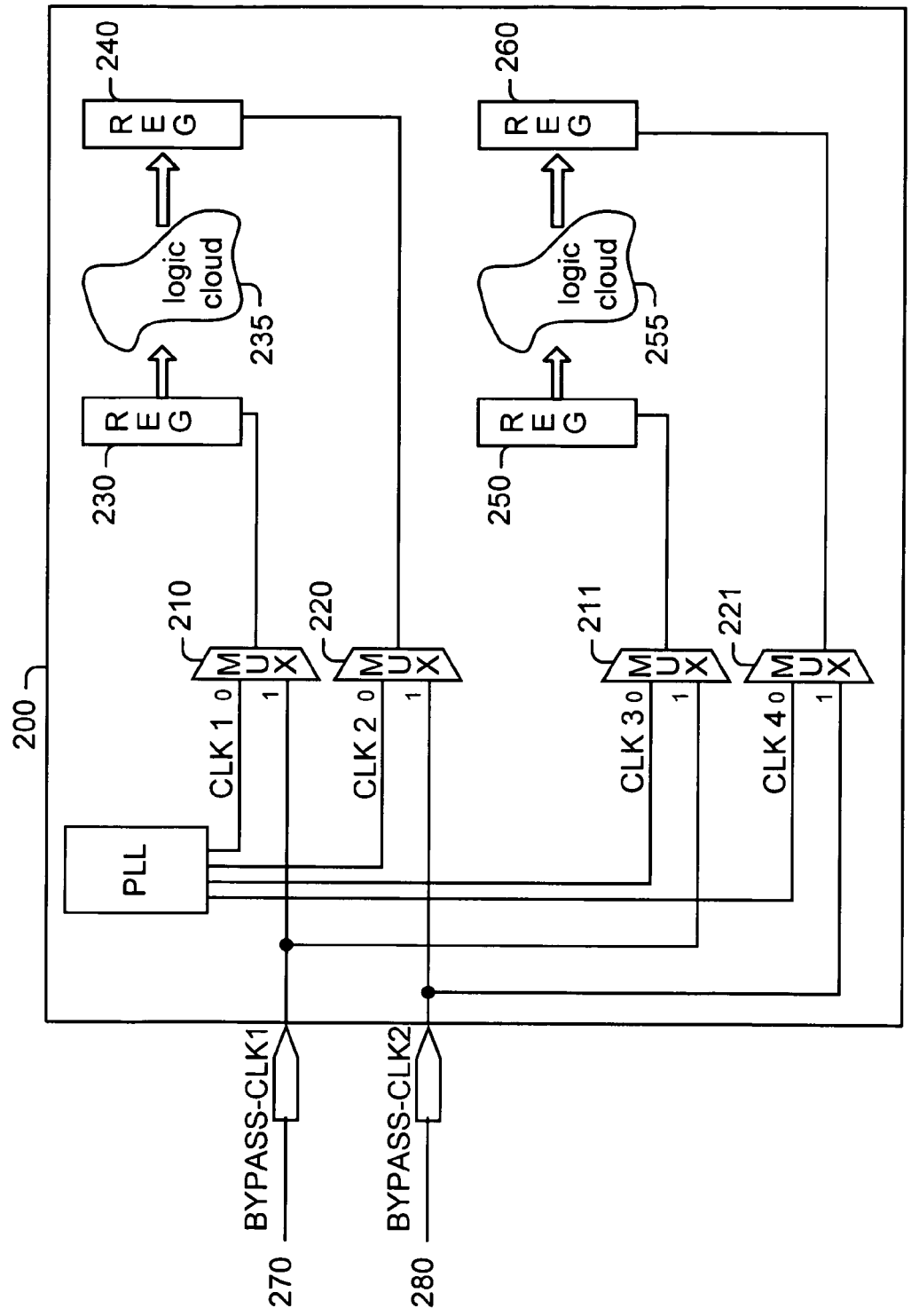
FIG. 3 is an exemplary schematic block diagram illustrating independent clock domains and dependent clock domains of a chip design in accordance with an embodiment of the present invention.

For example, referring to FIG. 3, in the capture mode, scan pattern data may be clocked into flip-flop register 230 by an external scan clock 270 provided by the ATPG tool 10. Data appears at the input of flip-flop register 240 after passing through and being modified by logic cloud 235. Data may next be clocked into flip flop register 240 by an external scan clock 280 provided by the ATPG tool 10. If the data captured in flip-flop register 240 does not match the expected data based on the original scan pattern data clocked into flip-flop register 230 and the effects of the logic cloud 235, then at least one capture mode violation has occurred. Assuming the flip-flop registers 230 and 240 were previously tested in a scan mode, then the capture mode violation is likely due to a timing problem in the logic cloud 235.

As a further example, if flip-flop register 230 and flip-flop register 240 were clocked at the same time by the same scan test clock 270, then capture mode violations would almost certainly occur since the two flip-flop registers do not constitute independent clock domains. In other words, since the two flip-flop registers are connected by a data path (i.e., the logic cloud 235), the data captured in flip-flop register 240 will not be the expected data since the scan pattern data being clocked into flip-flop register 230 and going through logic cloud 235 has not had time to properly settle down and become valid before flip-flop register 240 is clocked.

Therefore, it may be seen that, during timing analysis, clock domains that are not independent should be clocked by different clocks at different times to avoid capture mode violations. FIG. 3 shows that scan test clock 270 is coupled to clock domain 230 and clock domain 250 which are independent of each other (i.e., no data path between them). Also, scan test clock 280 is coupled to clock domain 240 and clock domain 260 which are independent of each other. As a result, it may be seen that independent clock domains may be grouped together and clocked by the same scan test clock during capture mode timing analysis. Any capture mode violations that occur are stored in the at least one memory module 22 in TA tool 20.

Step 170 checks for capture mode violations. If there are no capture mode violations, then the modified design of the chip is good and the previously determined clock domain groups may be frozen as part of the design. However, if there are any capture mode violations, then the clock domain groups are not truly independent according to the design. As a result, the process is repeated, using the capture mode violation information to try to form clock domain groups that are truly independent.

In an embodiment of the present invention, before the method 100 is performed, a scan test mode is entered and the scan chain functionality of the chip design is verified. The ATPG tool 10 may be used during the scan test mode to verify the scan chains.

Once there are no more capture mode violations, the design of the chip may be frozen, having the internal clock domain groupings and by-pass circuitry as part of the design of the chip at the core level.

Figure 4:
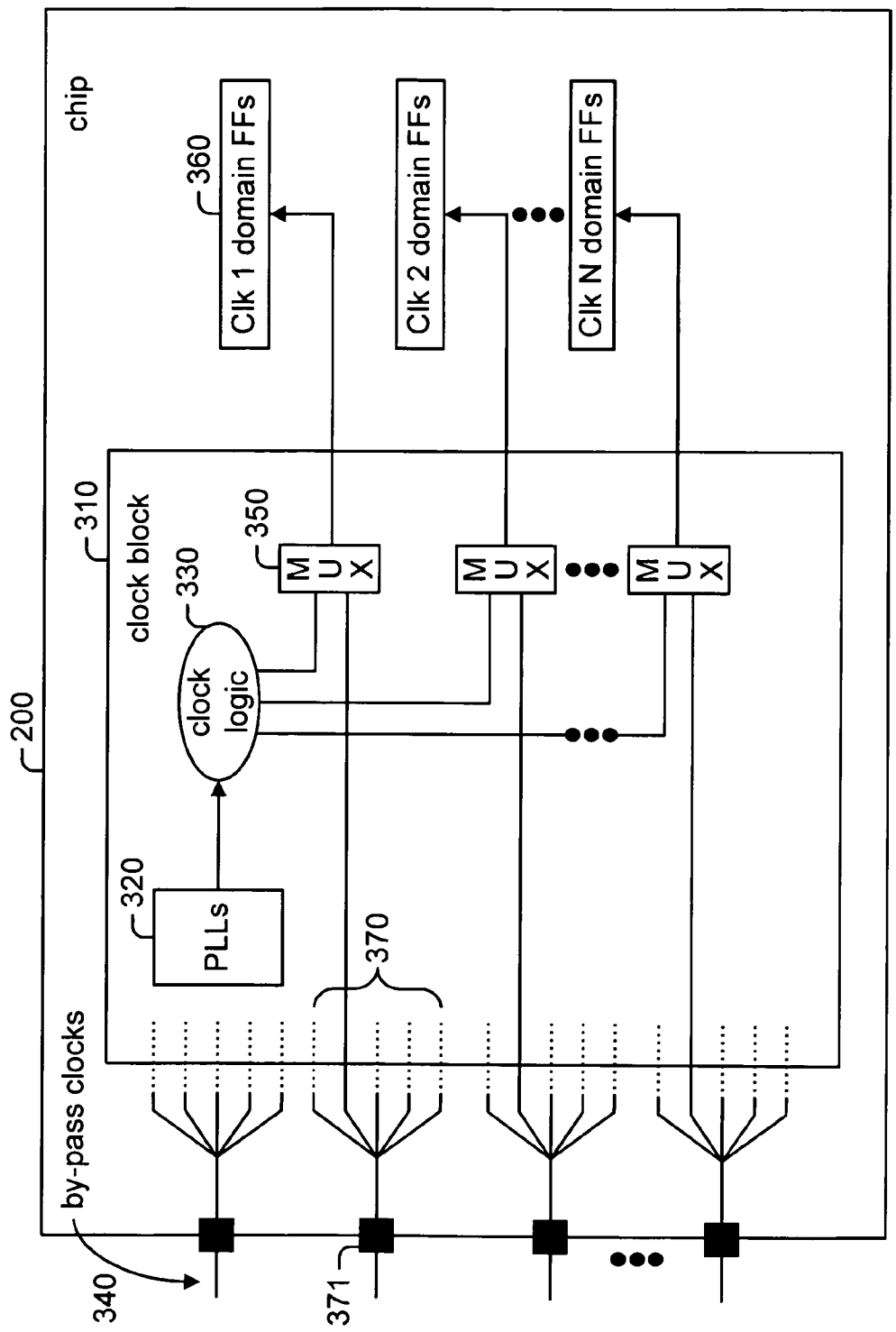
FIG. 4 is an exemplary schematic block diagram of a chip design illustrating the internal grouping of independent clock domains and the internal by-passing of internal clocks in accordance with an embodiment of the present invention.

FIG. 4 is an exemplary schematic block diagram of a resultant chip design illustrating the internal grouping of independent clock domains and the internal by-passing of internal clocks at the core level, in accordance with an embodiment of the present invention. Various clock groups have been formed (e.g., clock group 370) based on the clock domain independence analysis performed by the system 5 using the method 100. The chip design 200 comprises a clock block 310 with internal clock generating circuitry (e.g., PLLs 320 and clock logic 330). The clock logic may include various divider circuitry, gates, etc. The clock block 310 also comprises one mux 350 for each internally generated clock domain 360. The muxes 350 are used to by-pass the internal clocks of the chip design 200 and pass the scan test clocks 340 (by-pass clocks) during testing in the capture mode.

The independent clock domains (e.g., 370) are grouped together internally to the chip design (at the core level) and are tied together at ports of the chip (e.g., port 371). Each clock domain group is tied to one chip port. As a result, the number of scan test clocks and chip ports used for testing is greatly reduced. In a typical chip design, there may be approximately 100 clock domains. Embodiments of the present invention may limit the number of scan test clocks and chip ports used for testing to only ten (i.e., as much as a factor of 10 or more).

After a chip is actually built based on the final chip design, the chip may be tested by going into the capture mode using the same scan patterns used in testing of the simulated chip design. Only the outputs of the chip are tested for the expected results.

In summary, aspects of the present invention provide simulating a design of a digital integrated circuit chip to limit a number of scan test clocks and chip ports used for testing the chip. Clock domains are identified within the design of the chip that are independent of each other. The independent clock domains are grouped together to form clock domain groups at the core level of the chip design. A timing analysis is performed on the design of the chip by clocking the clock domain groups each with an independent scan test clock. The scan test clocks originate externally to the design, by-passing the corresponding internal clocks. Capture mode violations are recorded from the timing analysis and are used to go back and form new clock domain groups, thereby repeating the method until no capture mode violations are generated.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A system for simulating a design of a digital integrated circuit chip comprising:
    at least one processor module in an automatic test pattern generation (ATPG) tool used for first generating a clock grouping report based on identifying and grouping one or more independent clock domain groups, and modifying said design using said clock grouping report; and
    at least one processor module in a timing analysis (TA) tool for:
    verifying said design after modifying said design using said clock grouping report, said modifying performed by a computer based chip design tool residing off-line and outside of said ATPG tool, said ATPG tool communicatively coupled to said TA tool;
    second generating a timing analysis of said design definition file using a timing analysis tool to generate capture mode violations;
    transmitting said capture mode violations into said automatic test pattern generation (ATPG) tool, said automatic test pattern generation (ATPG) tool modifying said clock grouping reports to generate a modified clock grouping report based on said capture mode violations, said computer based chin design tool remodifying said design based on said modified clock grouping report; and
    reperforming said second generating and said transmitting until said capture model violations are not generated by said timing analysis (TA) tool.

2. The system of claim 1 wherein said ATPG tool comprises:
    at least one memory module; and
    at least one software simulation module residing in said at least one memory module and executed by said at least one processor module.

3. The system of claim 1 wherein said TA tool comprises:
    at least one memory module; and
    at least one software timing analysis module that is stored in said at least one memory module and is executed by said at least one processor module.

4. A system for performing clock domain minimization comprising:
    at least one processor module in a first tool used for, for at least:
    receiving a design definition file of an integrated circuit,
    identifying one or more independent clock domains associated with said design definition file based on a simulation performed by said first tool, grouping circuitry defined by said design definition file into one or more independent clock domains,
    first generating a clock grouping repost by said first tool, and
    modifying said design definition file based on said clock grouping report by tying each of said one or more independent clock domain groups to a corresponding port on said chip; and
    at least one processor module in a second tool for:
    second generating a timing analysis of said design definition file to generate capture mode violations,
    transmitting said capture mode violations to said first tool, said first tool modifying said clock grouping report to generate a modified clock grouping report based on said capture mode violations, said first tool remodifying said design definition filed based on said modified clock grouping report, and reperforming said second generating and said transmitting until said capture mode violations are not generated by said second tool.

5. The system of claim 4 wherein said first tool comprises:
   at least one memory module; and
   at least one software simulation module residing in said at least one memory module and executed by said at least one processor module.

6. The system of claim 4 wherein said second tool comprises:
   at least one memory module; and
   at least one software timing analysis module residing in said at least one memory module and executed by said at least one processor module.

7. The system of claim 4 wherein each of said one or more independent clock domains comprise at least one of flip-flops and logic gates.

8. The system of claim 4 wherein said timing analysis is performed by way of internally by-passing all internally generated clocks of said integrated circuit.

9. The system of claim 8 wherein said by-passing is implemented using one or more two input multiplexers.

10. A method of performing clock domain minimization in the implementation of a circuit design of a scan based integrated circuit chip comprising:
    first modifying an initial design definition file of said circuit design to internally by-pass all internally generated clocks, said first modifying generating a design definition file;
    inputting said design definition file into an automatic test pattern generation tool;
    identifying one or more independent clock domains associated with said design definition file based on a simulation performed by said automatic test pattern generation tool;
    grouping circuitry defined by said design definition file into one or more independent clock domain groups corresponding to said one or more independent clock domains;
    first generating a clock grouping report;
    second modifying said design definition file based on said clock grouping report by tying each of said one or more independent clock domain groups to a corresponding port on said chip;
    second generating a timing analysis of said design definition file using a timing analysis tool to generate capture mode violations;
    inputting said capture mode violations into said automatic test pattern generation tool;
    third generating a clock grouping report based on said capture mode violations; and
    reperforming said second modifying, said second generating, said inputting, and said third generating until said capture mode violations are not generated by said timing analysis tool.

11. The method of claim 10 further comprising entering a scan test mode before said first modifying is performed to verify scan chain functionality of said chip.

12. The method of claim 11 wherein said entering said scan mode to verify scan chain functionality is accomplished using said automatic test pattern generation tool during said scan test mode of said simulation.

13. The method of claim 10 wherein said each of said clock domain groups comprises at least one of flip-flops and logic gates.

14. The method of claim 10 wherein said first modifying to internally by-pass all internally generated clocks incorporates the use of one or more two input multiplexers.

15. A system comprising:
    a first processor in an automatic test pattern generation (ATPG) tool for:
    receiving a design definition file of a circuit design that has been modified by internally by-passing all internally generated clocks,
    identifying one or more independent clock domains associated with said first design definition file based on a simulation performed by said automatic test pattern generation tool,
    grouping circuitry defined by said design definition file into one or more independent clock domain groups corresponding to said one or more independent clock domains,
    first generating a clock grouping report, and
    modifying said design definition file based on said clock grouping report by tying each of said one or more independent clock domain groups to a corresponding port on an integrated circuit chip; and
    a second processor in a timing analysis (TA) tool for:
    second generating a timing analysis of said design definition file to generate capture mode violations,
    transmitting said capture mode violations into said automatic test pattern generation (ATPG) tool, said ATPG tool modifying said clock grouping report to generate a modified clock grouping report based on said capture mode violations, said ATPG tool remodifying said design definition file based on said modified clock grouping report, and
    reperforming said second generating and said transmitting step until said capture model violations are not generated by said timing analysis (TA) tool.

16. The system of claim 15 further comprising entering a scan test mode before said receiving is performed to verify scan chain functionality of said chip.

17. The system of claim 16 wherein said entering said scan mode to verify scan chain functionality is accomplished using said automatic test pattern generation tool during said scan test mode of said simulation.

18. The system of claim 15 wherein said each of said one or more independent clock domain groups comprises at least one of flip-flops and logic gates.

19. The system of claim 15 wherein said internally by-passing all internally generated clocks uses one or more two input multiplexers.

* * * * *